United States Patent
Dai et al.

(10) Patent No.: US 11,914,299 B2
(45) Date of Patent: *Feb. 27, 2024

(54) LITHOGRAPHY PROCESS WINDOW ENHANCEMENT FOR PHOTORESIST PATTERNING

(71) Applicant: Applied Materials, Inc., Santa Clara, CA (US)

(72) Inventors: Huixiong Dai, San Jose, CA (US); Mangesh Ashok Bangar, San Jose, CA (US); Srinivas D. Nemani, Sunnyvale, CA (US); Christopher S. Ngai, Burlingame, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/898,216

(22) Filed: Aug. 29, 2022

(65) Prior Publication Data

US 2022/0413387 A1    Dec. 29, 2022

Related U.S. Application Data

(63) Continuation of application No. 16/825,393, filed on Mar. 20, 2020, now Pat. No. 11,429,026.

(51) Int. Cl.
*G03F 7/20* (2006.01)
*H01L 21/027* (2006.01)
(Continued)

(52) U.S. Cl.
CPC .................. *G03F 7/20* (2013.01); *G03F 7/16* (2013.01); *G03F 7/30* (2013.01); *G03F 7/38* (2013.01); *H01L 21/0274* (2013.01)

(58) Field of Classification Search
CPC ..... G03F 7/20; G03F 7/16; G03F 7/30; G03F 7/38; H01L 21/0274; H01L 21/0273; H01L 21/67103; H01L 21/6831
(Continued)

(56) References Cited

U.S. PATENT DOCUMENTS

| | | | |
|---|---|---|---|
| 4,842,683 A | 6/1989 | Cheng et al. | |
| 5,215,619 A | 6/1993 | Cheng et al. | |

(Continued)

FOREIGN PATENT DOCUMENTS

| | | |
|---|---|---|
| CN | 102244023 A | 11/2011 |
| JP | 03-287168 | 12/1991 |

(Continued)

OTHER PUBLICATIONS

Office Action for Taiwan Patent Application No. 110108483 dated Feb. 9, 2023.

(Continued)

*Primary Examiner* — Caleen O Sullivan
(74) *Attorney, Agent, or Firm* — Patterson + Sheridan, LLP (57) ABSTRACT

A method for enhancing the depth of focus process window during a lithography process includes applying a photoresist layer comprising a photoacid generator on a material layer disposed on a substrate, exposing a first portion of the photoresist layer unprotected by a photomask to light radiation in a lithographic exposure process, providing a thermal energy to the photoresist layer in a post-exposure baking process, applying an electric field or a magnetic field while performing the post-exposure baking process, and dynamically changing a frequency of the electric field as generated while providing the thermal energy to the photoresist layer.

20 Claims, 5 Drawing Sheets

(51) Int. Cl.
  *G03F 7/30* (2006.01)
  *G03F 7/38* (2006.01)
  *G03F 7/16* (2006.01)

(58) Field of Classification Search
  USPC .............................................. 430/327, 330, 9
  See application file for complete search history.

(56) References Cited

U.S. PATENT DOCUMENTS

| | | | |
|---|---|---|---|
| 5,258,266 | A | 11/1993 | Tokui et al. |
| 5,345,145 | A | 9/1994 | Harafuji et al. |
| 5,731,123 | A | 3/1998 | Kawamura et al. |
| 6,079,358 | A | 6/2000 | Kim et al. |
| 6,113,731 | A | 9/2000 | Shan et al. |
| 6,143,124 | A | 11/2000 | Ahn |
| 6,187,152 | B1 | 2/2001 | Ting et al. |
| 6,242,164 | B1 | 6/2001 | Choi et al. |
| 6,376,152 | B2 | 4/2002 | Kawabe et al. |
| 6,488,807 | B1 | 12/2002 | Collins et al. |
| 6,686,132 | B2 | 2/2004 | Cheng et al. |
| 6,841,342 | B2 | 1/2005 | Nishi et al. |
| 6,889,627 | B1 | 5/2005 | Hao |
| 7,187,796 | B1 | 3/2007 | Phan et al. |
| 7,274,429 | B2 | 9/2007 | Paxton et al. |
| 7,318,997 | B2 | 1/2008 | Kim et al. |
| 7,374,867 | B2 | 5/2008 | Bristol et al. |
| 7,474,377 | B2 | 1/2009 | Matsuoka et al. |
| 7,780,366 | B2 | 8/2010 | Ogata et al. |
| 7,780,813 | B2 | 8/2010 | Pau et al. |
| 8,097,402 | B2 | 1/2012 | Scheer et al. |
| 8,829,393 | B2 | 9/2014 | Jennings et al. |
| 9,280,070 | B2 | 3/2016 | Xie et al. |
| 9,377,692 | B2 | 6/2016 | Xie et al. |
| 9,733,579 | B2 | 8/2017 | Nam et al. |
| 9,748,148 | B2 | 8/2017 | Yieh et al. |
| 9,798,240 | B2 | 10/2017 | Xie et al. |
| 9,829,790 | B2 | 11/2017 | Buchberger, Jr. et al. |
| 9,964,863 | B1 | 5/2018 | Babayan et al. |
| 10,203,604 | B2 | 2/2019 | Babayan et al. |
| 11,429,026 | B2 * | 8/2022 | Dai ..................... H01L 21/6831 |
| 2002/0096114 | A1 | 7/2002 | Carducci et al. |
| 2002/0123011 | A1 | 9/2002 | Kawano et al. |
| 2002/0129902 | A1 | 9/2002 | Babayan et al. |
| 2003/0037880 | A1 | 2/2003 | Carducci et al. |
| 2004/0001787 | A1 | 1/2004 | Porshnev et al. |
| 2004/0016637 | A1 | 1/2004 | Yang et al. |
| 2005/0074706 | A1 | 4/2005 | Bristol et al. |
| 2005/0250052 | A1 | 11/2005 | Nguyen |
| 2006/0130751 | A1 | 6/2006 | Volfovski et al. |
| 2006/0177586 | A1 | 8/2006 | Ishida et al. |
| 2007/0000613 | A1 | 1/2007 | Pau et al. |
| 2007/0077171 | A1 | 4/2007 | Hamada |
| 2007/0144439 | A1 | 6/2007 | Englhardt et al. |
| 2007/0177870 | A1 | 8/2007 | Hamada |
| 2008/0008967 | A1 | 1/2008 | Chang et al. |
| 2008/0050679 | A1 | 2/2008 | Salek et al. |
| 2008/0145797 | A1 | 6/2008 | Verbeke et al. |
| 2008/0182412 | A1 | 7/2008 | Bailey, III et al. |
| 2008/0304940 | A1 | 12/2008 | Auer-Jongepier et al. |
| 2009/0002722 | A1 | 1/2009 | Hayasaki et al. |
| 2009/0142926 | A1 | 6/2009 | Dai et al. |
| 2009/0211523 | A1 | 8/2009 | Kuppurao et al. |
| 2010/0009274 | A1 | 1/2010 | Yamamoto |
| 2010/0203299 | A1 | 8/2010 | Abdallah et al. |
| 2011/0164234 | A1 | 7/2011 | Wang et al. |
| 2011/0165515 | A1 | 7/2011 | Wang et al. |
| 2012/0031894 | A1 | 2/2012 | Shigetomi |
| 2012/0103939 | A1 | 5/2012 | Wu et al. |
| 2012/0129108 | A1 | 5/2012 | Aqad et al. |
| 2012/0244645 | A1 | 9/2012 | Rathsack et al. |
| 2012/0285621 | A1 | 11/2012 | Tan |
| 2012/0322011 | A1 | 12/2012 | Wu et al. |
| 2012/0325784 | A1 | 12/2012 | Moffatt et al. |
| 2014/0193755 | A1 | 7/2014 | Wise et al. |
| 2015/0135993 | A1 | 5/2015 | Buckland et al. |
| 2015/0218697 | A1 | 8/2015 | Nguyen et al. |
| 2015/0325411 | A1 | 11/2015 | Godet et al. |
| 2015/0355549 | A1 | 12/2015 | Xie et al. |
| 2016/0011515 | A1 | 1/2016 | Xie et al. |
| 2016/0329222 | A1 | 11/2016 | Xie et al. |
| 2016/0357107 | A1 | 12/2016 | Buchberger, Jr. et al. |
| 2018/0004094 | A1 | 1/2018 | Hanson et al. |
| 2018/0102282 | A1 | 4/2018 | Krysak et al. |
| 2018/0164689 | A1 | 6/2018 | Sano et al. |
| 2020/0161181 | A1 | 5/2020 | Wang et al. |

FOREIGN PATENT DOCUMENTS

| | | |
|---|---|---|
| JP | 2003-124088 A | 4/2003 |
| JP | 2005-203597 A | 7/2005 |
| JP | 2006-032605 A | 2/2006 |
| JP | 2017-034233 A | 2/2017 |
| JP | 2017-525131 A | 8/2017 |
| KR | 10-2005-0032869 A | 4/2005 |
| KR | 20140036166 A | 3/2014 |
| KR | 101647158 B1 | 8/2016 |
| KR | 2017-0107592 A | 9/2017 |
| TW | 201614388 A | 4/2016 |
| WO | 2015/191209 A1 | 12/2015 |
| WO | 2018-004815 A1 | 1/2018 |

OTHER PUBLICATIONS

U.S. Appl. No. 16/600,101, filed Oct. 11, 2019 Entitled "A Film Structure for Electric Field Guided Photoresist Patterning Process".
U.S. Appl. No. 16/825,388, filed Mar. 20, 2020 Entitled "Photoresist Patterning Process".
Jung, Byungki, et al., "LWR Reduction and Flow of Chemically Amplified Resist Patterns During Sub-Millisecond D : 1 Heating", Advances in Resist Materials and Processing Technology XXVIII, vol. 7972, 79722S, 2011. (8 pgs.).
Jung, Byungki, et al. "Kinetic Rates of Thermal Transformations and Diffusion in Polymer Systems Measured during Sub-millisecond Laset-Induced Heating", American Chemical Society, vol. 6, No. 7, pp. 5830-5836, 2012.
Conference proceedings of SPIE 2016, "EUV resists: What's next?," Lio, Anna.
Office Action for U.S. Appl. No. 14/677,552 dated Jul. 1, 2016.
Conference proceedings of SPIE 2017, "Lithographic stochastics: Beyond 3sigma," Bristol, Robert, Krysak, Marie.
Office Action for U.S. Appl. No. 14/677,552 dated Jun. 16, 2017.
Written Opinion for PCT/US2017/059969 dated Feb. 9, 2018.
Office Action for Taiwan Application No. 106140879 dated Nov. 13, 2019.
International Search Report and Written Opinion for PCT/US2019/055863 dated Jan. 30, 2020.
Communication pursuant to Ruie 164(1) EPC and Search Report for European Application No. 17885260.4 dated Jun. 16, 2020.
De Bisschop, Peter, Journal of Micro/Nanolithogarphy, MEMS MOEMS, Stochastic effects in EUV lithography: random, local CD variability, and printing failures, 16(4), Apr. 10, 2013 (2017), 18 pp.
International Search Report and Written Opinion dated May 26, 2021 for Application No. PCT/US2021/016301.
Office Action for Japanese Application No. 2022-556160 dated Nov. 7, 2023.

* cited by examiner

LITHOGRAPHY PROCESS WINDOW ENHANCEMENT FOR PHOTORESIST PATTERNING

CROSS-REFERENCE TO RELATED APPLICATIONS

This Application is a continuation of U.S. Non-Provisional application Ser. No. 16/825,393, filed on Mar. 20, 2020 of which is incorporated herein by reference in its entirety.

BACKGROUND

Field

The present disclosure generally relates to methods and apparatuses for processing a substrate, and more specifically to methods and apparatuses for enhancing photoresist profile control.

Description of the Related Art

Integrated circuits have evolved into complex devices that can include millions of components (e.g., transistors, capacitors, and resistors) on a single chip. Photolithography may be used to form components on a chip. Generally the process of photolithography involves a few basic stages. Initially, a photoresist layer is formed on a substrate. The photoresist layer may be formed by, for example, spin-coating. The photoresist layer may include a resist resin and a photoacid generator. The photoacid generator, upon exposure to electromagnetic radiation in a subsequent exposure stage, alters the solubility of the photoresist in the development process. Excess solvent may be removed in a pre-exposure bake process.

In the exposure stage, a photomask or reticle may be used to selectively expose certain regions of a photoresist layer disposed on the substrate to electromagnetic radiation. Other exposure methods may be maskless exposure methods. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Exposure to the electromagnetic radiation may decompose the photoacid generator, which generates acid and results in a latent acid image in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

Figure 1:
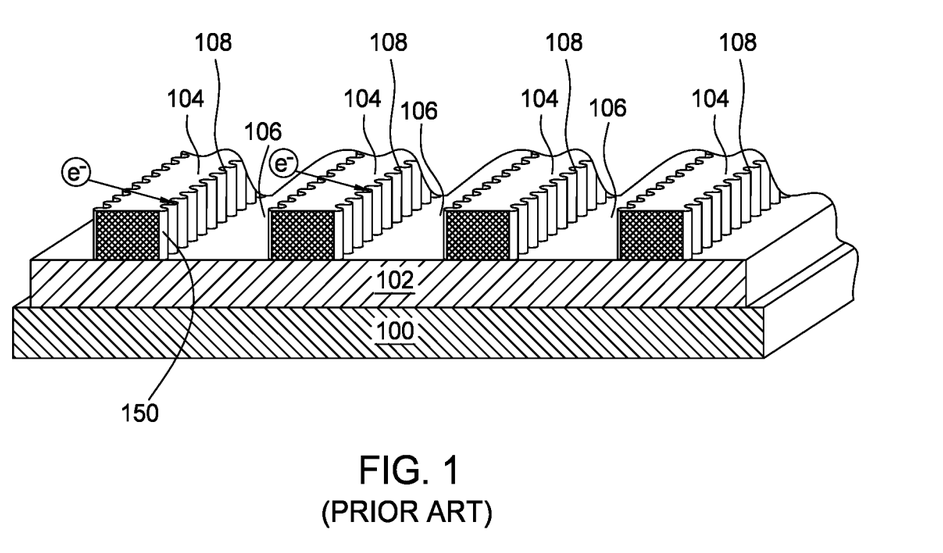
FIG. 1 depicts an orthogonal cross-sectional view of an exemplary structure of a patterned photoresist layer disposed on a substrate conventionally in the art.

After the post-exposure bake, the substrate, and, particularly, the photoresist layer may be developed and rinsed. After development and rinsing, a patterned photoresist layer is then formed on the substrate, as shown in FIG. 1. FIG. 1 depicts an exemplary orthogonal sectional view of the substrate 100 having a patterned photoresist layer 104 disposed on a target material 102 to be etched. Openings 106 are defined between the patterned photoresist layer 104, after the development and rinse processes, exposing the underlying target material 102 for etching to transfer features onto the target material 102. However, inaccurate control or low resolution of the lithography exposure process may not retain critical dimensions of the photoresist layer 104, resulting in an unacceptable line width roughness 108. Furthermore, during the exposure process, acid (as shown in FIG. 1) generated from the photoacid generator may randomly diffuse to any region, including the regions protected under the mask unintended to be diffused, thus creating undesired wiggling or roughness profile 150 at the edge or interface of the patterned photoresist layer 104 interfaced with the openings 106. Large line width roughness 108 and undesired wiggling profile 150 of the photoresist layer 104 may result in inaccurate feature transfer to the target material 102, thus, eventually leading to device failure and yield loss.

Therefore, there is a need for a method and an apparatus to control line width roughness and enhance resolution as well as dose sensitivity so as to obtain a patterned photoresist layer with desired critical dimensions.

SUMMARY

Embodiments of the present disclosure include methods for efficient control of distribution and diffusion of acid from a photoacid generator in a photoresist layer during a post-exposure baking process so as to improve the lithography process window, such as the range for depth of focus. The methods can enhance and enlarge the depth of focus process window during a lithography process.

In one embodiment, a method of processing a substrate includes applying a photoresist layer comprising a photoacid generator on a material layer disposed on a substrate, exposing a first portion of the photoresist layer unprotected by a photomask to light radiation in a lithographic exposure process, providing a thermal energy to the photoresist layer in a post-exposure baking process, applying an electric field or a magnetic field while performing the post-exposure baking process, and dynamically changing a frequency of the electric field as generated while providing the thermal energy to the photoresist layer.

In another embodiment, a method of processing a substrate includes applying a photoresist layer on a substrate, exposing a first portion of the photoresist layer unprotected by a photomask to light radiation in a lithographic exposure process, performing a post-exposure baking process on the photoresist layer, and changing a drifting direction of a photoacid generator vertically in the photoresist layer while providing the thermal energy to the photoresist layer.

In yet another embodiment, a device structure includes a material layer disposed on a substrate, and a plurality of openings formed in the material layer, wherein the openings formed across the substrate have a corner angle between about 85 degrees and 95 degrees.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods for enhancing profile control of a photoresist layer formed by photolithography are provided. The diffusion of acid generated by a photoacid generator during a post-exposure baking process that contributes to line edge/width roughness may be controlled by adjusting the electric field applied during the post-exposure baking process. The electric field application controls the diffusion and distribution of the acids generated by the photoacid generator in the photoresist layer, thus enlarging the process window that enhances the lithography resolution. For example, the range for the focus of depth during the lithography process may be efficiently improved and enlarged with the proper control and assistance of the diffusion of acid generated by a photoacid generator during the post-exposure baking process. Suitable process parameters controlled during the post-exposure baking process include voltage level and the frequency for controlling the electric field as generated during the baking process, continuous or pulse mode of the voltage power for generating the electric field, temperature control of the substrate, and electric field applied duration during the post-exposure baking process. In one example, a dynamic frequency control during the post-exposure baking process may be utilized.

Figure 2:
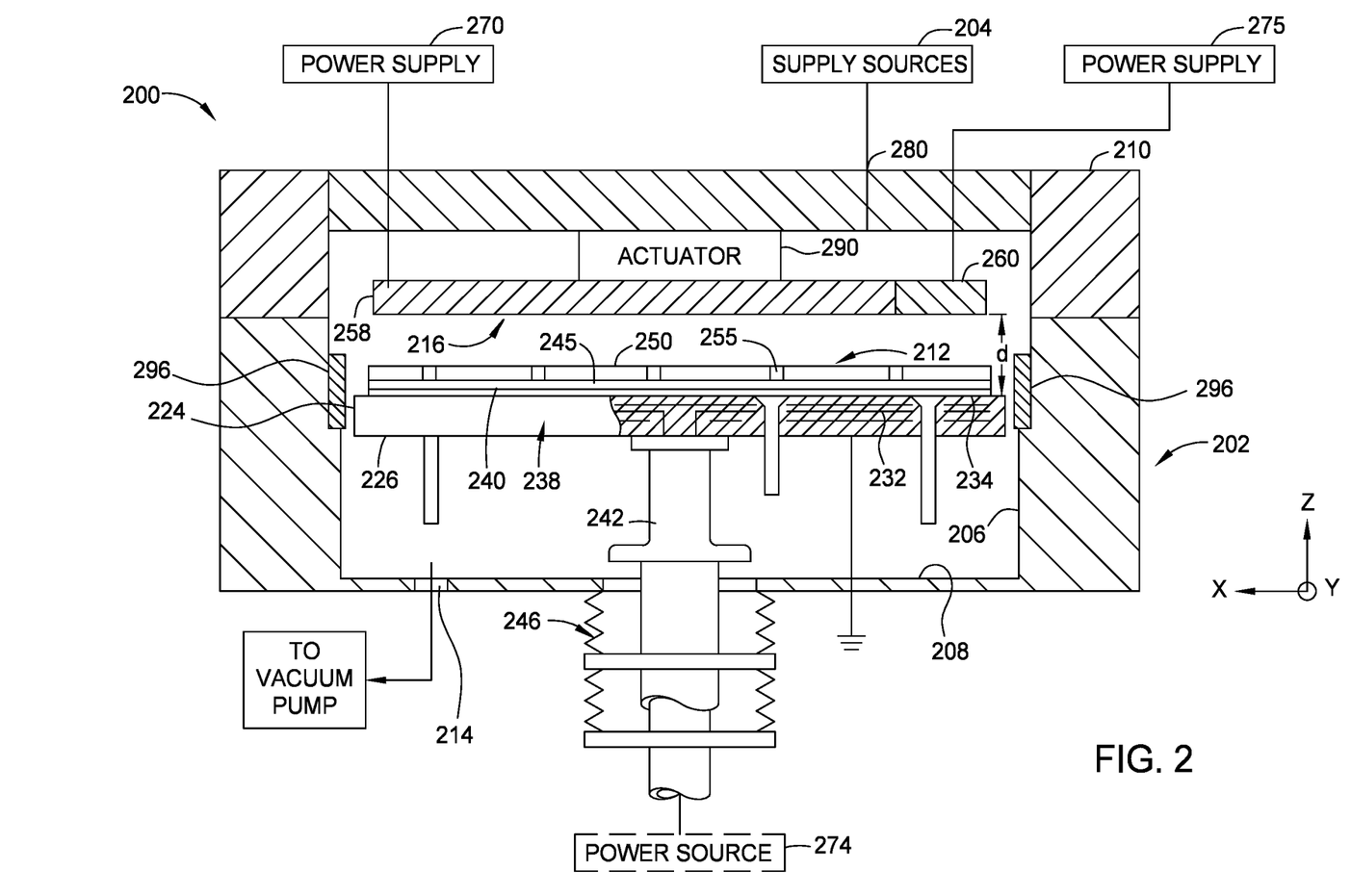
FIG. 2 is a schematic cross-sectional view of an apparatus for processing a substrate, according to one embodiment.

FIG. 2 is a schematic cross-sectional view of an apparatus for processing a substrate, according to one embodiment. As shown in the embodiment of FIG. 2, the apparatus may be in the form of a vacuum processing chamber 200. In other embodiments, the processing chamber 200 may not be coupled to a vacuum source.

The processing chamber 200 may be an independent standalone processing chamber. Alternatively, the processing chamber 200 may be part of a processing system, such as, for example, an in-line processing system, a cluster processing system, or a track processing system. The processing chamber 200 is described in detail below and may be used for a pre-exposure bake, a post-exposure bake, and/or other processing steps.

The processing chamber 200 includes chamber walls 202, an electrode assembly 216, and a substrate support assembly 238. The chamber walls 202 include sidewalls 206, a lid assembly 210, and a bottom 208. The chamber walls 202 partially enclose a processing volume 212. The processing volume 212 is accessed through a substrate transfer port (not shown) configured to facilitate movement of a substrate 240 into and out of the processing chamber 200. In embodiments where the processing chamber 200 is part of a processing system, the substrate transfer port may allow for the substrate 240 to be transferred to and from an adjoining transfer chamber.

A pumping port 214 may optionally be disposed through one of the lid assembly 210, sidewalls 206 or bottom 208 of the processing chamber 200 to couple the processing volume 212 to an exhaust port. The exhaust port couples the pumping port 214 to various vacuum pumping components, such as a vacuum pump. The pumping components may reduce the pressure of the processing volume 212 and exhaust any gases and/or process by-products out of the processing chamber 200. The processing chamber 200 may be coupled to one or more supply sources 204 for delivering one or more source compounds into the processing volume 212.

The substrate support assembly 238 is centrally disposed within the processing chamber 200. The substrate support assembly 238 supports the substrate 240 during processing. The substrate support assembly 238 may include a body 224 that encapsulates at least one embedded heater 232. In some embodiments, the substrate support assembly 238 may be an electrostatic chuck. The heater 232, such as a resistive element, is disposed in the substrate support assembly 238. The heater 232 controllably heats the substrate support assembly 238 and the substrate 240 positioned thereon to a predetermined temperature. The heater 232 is configured to quickly ramp the temperature of the substrate 240 and to accurately control the temperature of the substrate 240. In some embodiments, the heater 232 is connected to and controlled by a power source 274. The power source 274 may alternatively or additionally apply power to the substrate support assembly 238. The power source 274 may be configured similarly to a power source 270, discussed below. Furthermore, it is noted that the heater 232 may be disposed in other locations of the processing chamber 200, such as in the chamber wall, chamber liner, edge ring that circumscribes the substrate, the chamber ceiling and the like, as needed to provide thermal energy to the substrate 240 disposed on the substrate support assembly 238.

In some embodiments, the substrate support assembly 238 may be configured to rotate. In some embodiments, the substrate support assembly 238 is configured to rotate about the z-axis. The substrate support assembly 238 may be configured to continuously or constantly rotate, or the substrate support assembly 238 may be configured to rotate in a step-wise or indexing manner. For example, the substrate support assembly 238 may rotate a predetermined amount, such as 90°, 180°, or 270°, and then rotation may stop for a predetermined amount of time.

Generally, the substrate support assembly 238 has a first surface 234 and a second surface 226. The first surface 234 is opposite the second surface 226. The first surface 234 is configured to support the substrate 240. The second surface 226 has a stem 242 coupled thereto. The substrate 240 may be any type of substrate, such as a dielectric substrate, a glass substrate, a semiconductor substrate, or a conductive substrate. The substrate 240 may have a material layer 245 disposed thereon. The material layer 245 may be any desired layer. In some embodiments, the substrate 240 may have more than one material layer 245. The substrate 240 also has a photoresist layer 250 disposed over the material layer 245. The substrate 240 has been previously exposed to electromagnetic radiation in an exposure stage of a photolithography process. The photoresist layer 250 has latent image lines 255 formed therein from the exposure stage. The latent image lines 255 may be substantially parallel. In other embodiments, the latent image lines 255 may not be substantially parallel. Also as shown, the first surface 234 of the substrate support assembly 238 is separated from the electrode assembly 216 by a distance d in the z-direction. The stem 242 is coupled to a lift system (not shown) for moving the substrate support assembly 238 between an elevated processing position (as shown) and a lowered substrate transfer position. The lift system may accurately and precisely control the position of the substrate 240 in the z-direction. In some embodiments, the lift system may also be configured to move the substrate 240 in the x-direction, the y-direction, or the x-direction and the y-direction. The stem 242 additionally provides a conduit for electrical and thermocouple leads between the substrate support assembly 238 and other components of the processing chamber 200. A bellows 246 is coupled to the substrate support assembly 238 to provide a vacuum seal between the processing volume 212 and the atmosphere outside the processing chamber 200 and facilitate movement of the substrate support assembly 238 in the z-direction.

The lid assembly 210 may optionally include an inlet 280 through which gases provided by supply sources 204 may enter the processing chamber 200. The supply sources 204 may optionally controllably pressurize the processing volume 212 with a gas, such as nitrogen, argon, helium, other gases, or combinations thereof. The gases from the supply sources 204 may create a controlled environment within the processing chamber 200. An actuator 290 may be optionally coupled between the lid assembly 210 and the electrode assembly 216. The actuator 290 is configured to move the electrode assembly 216 in one or more of the x, y, and z directions. The x and y directions are referred to herein as the lateral directions or dimensions. The actuator 290 enables the electrode assembly 216 to scan the surface of the substrate 240. The actuator 290 also enables the distance d to be adjusted. In some embodiments the electrode assembly 216 is coupled to the lid assembly 210 by a fixed stem (not shown). In other embodiments, the electrode assembly 216 may be coupled to the inside of the bottom 208 of the processing chamber 200, to the second surface 226 of the substrate support assembly 238, or to the stem 242. In still other embodiments, the electrode assembly 216 may be embedded between the first surface 234 and the second surface 226 of the substrate support assembly 238.

The electrode assembly 216 includes at least a first electrode 258 and a second electrode 260. As shown, the first electrode 258 is coupled to the power source 270, and the second electrode 260 is coupled to an optional power supply 275. In other embodiments, one of the first electrode 258 and the second electrode 260 may be coupled to a power supply and the other electrode may be coupled to a ground. In some embodiments, the first electrode 258 and the second electrode 260 are coupled to a ground and the power source 274 that delivers power to the substrate support is a bipolar power supply that switches between a positive and negative bias. In some embodiments, the power source 270 or the power supply 275 may be coupled to both the first electrode 258 and the second electrode 260. In other embodiments, the power source 270 or the power supply 275 may be coupled to the first electrode 258, the second electrode 260, and the substrate support assembly 238. In such embodiments, the pulse delay to each of the first electrode 258, the second electrode 260, and the substrate support assembly 238 may be different. The electrode assembly 216 may be configured to generate an electric field parallel to the x-y plane defined by the first surface of the substrate support assembly 238. For example, the electrode assembly 216 may be configured to generate an electric field in one of the y direction, x direction or other direction in the x-y plane.

The power source 270 and the power supply 275 are configured to supply, for example, between about 500 V and about 100 kV to the electrode assembly 216, to generate an electric field having a strength between about 0.1 MV/m and about 100 MV/m. In some embodiments, the power source 274 may also be configured to provide power to the electrode assembly 216. In some embodiments, any or all of the power source 270, the power source 274, or the power supply 275 are a pulsed direct current (DC) power supply. The pulsed DC wave may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or all of the power source 270, the power source 274, and the power supply 275 are an alternating current power supply. In other embodiments, any or all of the power source 270, the power source 274, and the power supply 275 are a direct current power supply.

In some embodiments, any or all of the power source 270, the power source 274, and the power supply 275 may use a DC offset. The DC offset may be, for example, between about 0% and about 75% of the applied voltage, such as between about 5% and about 60% of the applied voltage. In some embodiments, the first electrode 258 and the second electrode 260 are pulsed negatively while the substrate support assembly 238 is also pulsed negatively. In these embodiments, the first electrode 258 and the second electrode 260 and the substrate support assembly 238 are synchronized but offset in time. For example, the first electrode 258 may be at the "one" state while the substrate support assembly is at the "zero" state, then the substrate support assembly 238 may be at the "one" state while the first electrode 258 is at the "zero" state.

The electrode assembly 216 spans approximately the width of the substrate support assembly 238. In other embodiments, the width of the electrode assembly 216 may be less than that of the substrate support assembly 238. For example, the electrode assembly 216 may span between about 10% and about 80%, such as between about 20% and about 40%, the width of the substrate support assembly 238. In embodiments where the electrode assembly 216 is less wide than the substrate support assembly 238, the actuator 290 may scan the electrode assembly 216 across the surface of the substrate 240 positioned on the first surface 234 of the substrate support assembly 238. For example, the actuator 290 may scan such that the electrode assembly 216 scans the entire surface of the substrate 240. In other embodiments, the actuator 290 may scan only certain portions of the substrate 240. Alternatively, the substrate support assembly 238 may scan underneath the electrode assembly 216.

In some embodiments, one or more magnets 296 may be positioned in the processing chamber 200. In the embodiment shown in FIG. 1, the magnets 296 are coupled to the inside surface of the sidewalls 206. In other embodiments, the magnets 296 may be positioned in other locations within the processing chamber 200 or outside the processing chamber 200. The magnets 296 may be, for example, permanent magnets or electromagnets. Representative permanent magnets include ceramic magnets and rare earth magnets. In embodiments where the magnets 296 include electromagnets, the magnets 296 may be coupled to a power source (not shown). The magnets 296 are configured to generate a magnetic field in a direction perpendicular or parallel to the direction of the electric field lines generated by the electrode assembly 216 at the first surface 234 of the substrate support assembly 238. For example, the magnets 296 may be configured to generate a magnetic field in the x-direction when the electric field generated by the electrode assembly 216 is in the y-direction. The magnetic field drives a charged species 355 (shown in FIG. 3) and polarized species (not shown) generated by the photoacid generators in the photoresist layer 250 in a direction perpendicular to the magnetic field, such as the direction parallel with the latent image lines 255. By driving the charged species 355 and polarized species in a direction parallel with the latent image lines 255, the line profile of the exposed photoresist layer may be controlled. The uniform directional and/or controlled movement of the charged species 355 and polarized species is shown by a double headed arrow 370 in FIG. 3. In contrast, when a magnetic field is not applied, the charged species 355 and polarized species may move randomly, as shown by arrows 370'.

Figure 3:
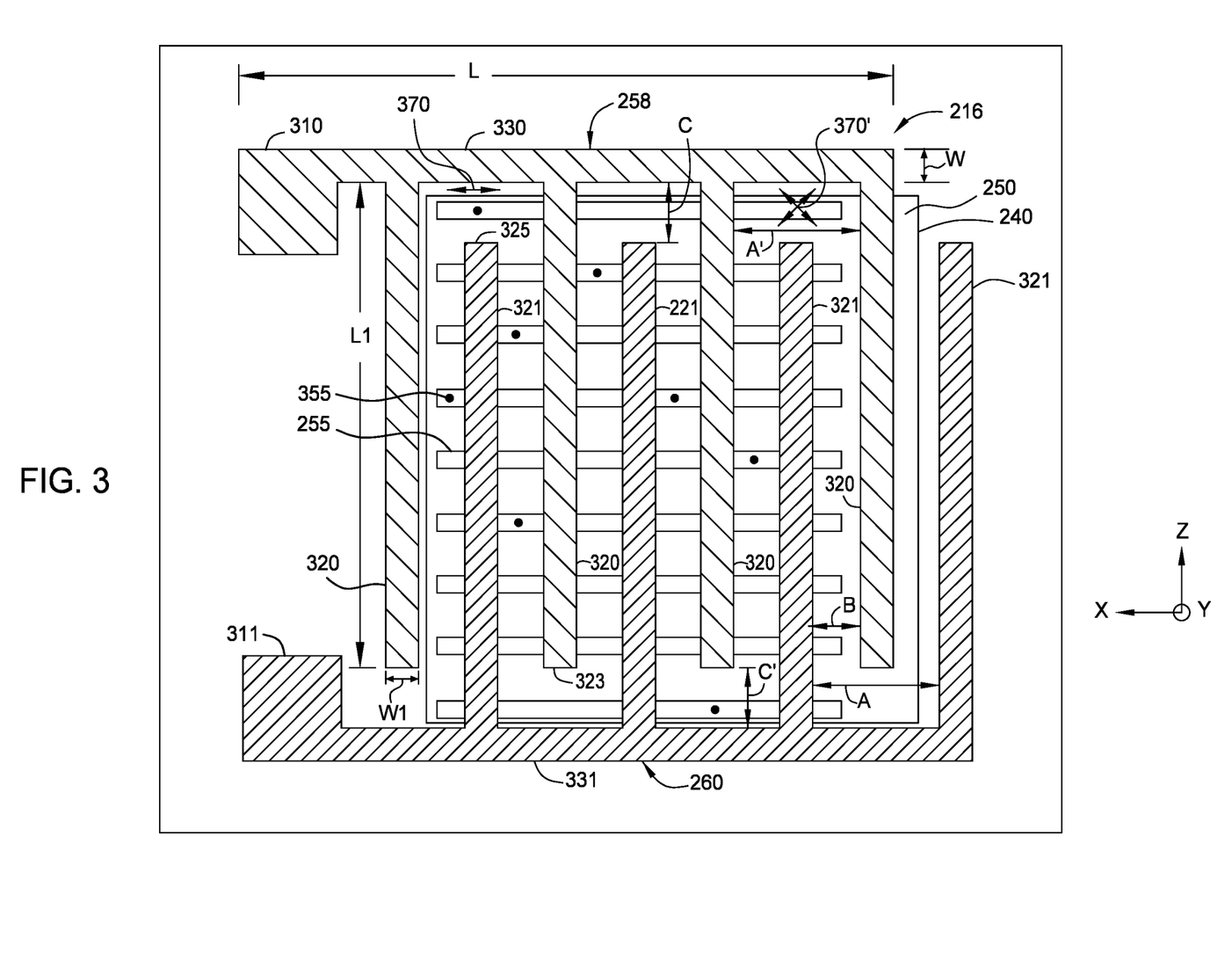
FIG. 3 is a top cross-sectional view of one embodiment of an electrode assembly disposed in the apparatus of FIG. 2.

Continuing to refer to FIG. 3, the electrode assembly 216 includes at least the first electrode 258 and the second electrode 260. The first electrode 258 includes a first terminal 310, a first support structure 330, and one or more antennas 320. The second electrode 260 includes a second terminal 311, a second support structure 331, and one or more antennas 321. The first terminal 310, the first support structure 330, and the one or more antennas 320 of the first electrode 258 may form a unitary body. Alternatively, the first electrode 258 may include separate portions that may be coupled together. For example, the one or more antennas 320 may be detachable from the first support structure 330. The second electrode 260 may similarly be a unitary body or be comprised of separate detachable components. The first electrode 258 and the second electrode 260 may be fabricated by any suitable technique. For example, the first electrode 258 and the second electrode 260 may be fabricated by machining, casting, or additive manufacturing.

The first support structure 330 may be made from a conductive material. For example, the first support structure 330 may be made of silicon, polysilicon, silicon carbide, molybdenum, aluminum, copper, graphite, silver, platinum, gold, palladium, zinc, other materials, or mixtures thereof. The first support structure 330 may have any desired dimensions. For example, the length L of the first support structure 330 may be between about 25 mm and about 450 mm, for example, between about 100 mm and about 300 mm. In some embodiments, the first support structure 330 has a length L approximately equal to a diameter of a standard semiconductor substrate. In other embodiments, the first support structure 330 has a length L that is larger or smaller than the diameter of a standard semiconductor substrate. For example, in different representative embodiments, the length L of the first support structure 330 may be about 25 mm, about 51 mm, about 76 mm, about 100 mm, about 150 mm, about 200 mm, about 300 mm, or about 450 mm. The width W of the first support structure 330 may be between about 2 mm and about 25 mm. In other embodiments, the width W of the first support structure 330 is less than about 2 mm. In other embodiments, the width W of the first support structure 330 is greater than about 25 mm. The thickness of the first support structure 330 may be between about 1 mm and about 10 mm, such as between about 2 mm and about 8 mm, such as about 5 mm. In some embodiments, the first support structure 330 may be square, cylindrical, rectangular, oval, or other shapes. Embodiments having curved exterior surfaces may avoid arcing.

The second support structure 331 may be made of the same materials as the first support structure 330. The range of dimensions suitable for the first support structure 330 is also suitable for the second support structure 331. In some embodiments, the first support structure 330 and the second support structure 331 are made of the same material. In other embodiments, the first support structure 330 and the second support structure 331 are made of different materials. The lengths L, widths W, and thicknesses of the first support structure 330 and the second support structure 331 may be the same or different.

The one or more antennas 320 of the first electrode 258 may also be made from a conductive material. The one or more antennas 320 may be made from the same materials as the first support structure 330. The one or more antennas 320 of the first electrode 258 may have any desired dimensions. For example, a length L1 of the one or more antennas 320 may be between about 25 mm and about 450 mm, for example, between about 100 mm and about 300 mm. In some embodiments, the one or more antennas 320 has a length L1 approximately equal to the diameter of a standard substrate. In other embodiments, the length L1 of the one or more antennas 320 may be between about 75% and 90% of the diameter of a standard substrate. A width W1 of the one or more antennas 320 may be between about 2 mm and about 25 mm. In other embodiments, the width W1 of the one or more antennas 320 is less than about 2 mm. In other embodiments, the width W1 of the one or more antennas 320 is greater than about 25 mm. The thickness of the one or more antennas 320 may be between about 1 mm and about 10 mm, such as between about 2 mm and about 8 mm. The one or more antennas 320 may have a cross-section that is square, rectangular, oval, circular, cylindrical, or another shape. Embodiments having round exterior surfaces may avoid arcing.

Each of the antennas 320 may have the same dimensions. Alternatively, some of the one or more antennas 320 may have different dimensions than one or more of the other antennas 320. For example, some of the one or more antennas 320 may have different lengths L1 than one or more of the other antennas 320. Each of the one or more antennas 320 may be made of the same material. In other embodiments, some of the antennas 320 may be made of a different material than other antennas 320.

The antennas 321 may be made of the same range of materials as the antennas 320. The range of dimensions suitable for the antennas 320 is also suitable for the antennas 321. In some embodiments, the antennas 320 and the antennas 321 are made of the same material. In other embodiments, the antennas 320 and the antennas 321 are made of different materials. The lengths L1, widths W1, and thicknesses of the antennas 320 and the antennas 321 may be the same or different.

The antennas 320 may include between 1 and about 40 antennas 320. For example, the antennas 320 may include between about 4 and about 40 antennas 320, such as between about 10 and about 20 antennas 320. In other embodiments, the antennas 320 may include more than 40 antennas 320. In some embodiments, each of the antennas 320 may be substantially perpendicular to the first support structure 330. For example, in embodiments where the first support structure 330 is straight, each antenna 320 may be substantially parallel to the first support structure 330. Each of the antennas 320 may be substantially parallel to each of the other antennas 320. Each of the antennas 321 may be similarly positioned with respect to the support structure 331 and each other antenna 321.

Each of the antennas 320 has a terminal end 323. Each of the antennas 321 has a terminal end 325. A distance C is defined between the first support structure 330 and the terminal end 325. A distance C' is defined between the second support structure 331 and the terminal end 323. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 321 and an adjacent one of the antennas 321. A distance A' is defined between facing surfaces of one antenna 320 and an adjacent one the antennas 320. The distances A and A' may be greater than about 6 mm. For example, the distances A and A' may be between about 6 mm and about 20 mm, such as between about 10 mm and about 15 mm. The distances A and A' between each adjacent antennas 321, 320 may be the same or different. For example, the distances A' between the first and second, second and third, and third and fourth antennas of the one or more antennas 320 may be different. In other embodiments, the distances A' may be the same.

A distance B is defined between facing surfaces of one of the antennas 320 and an adjacent one of the antennas 321. The distance B may be, for example, greater than about 1 mm. For example, the distance B may be between about 2 mm and about 10 mm, such as between about 4 mm and about 6 mm. The distance B defined between may be the same, each distance B may be different, or some distances B may be the same and some distances B may be different. Adjusting the distance B allows for easy control of the electric field strength.

The antennas 320, 321 may be oriented in an alternating arrangement above the photoresist layer 250. For example, the antennas 320 of the first electrode 258 and the antennas 321 of the second electrode 260 may be positioned such that at least one of the antennas 320 is positioned between two of the antennas 321. Additionally, at least one antenna 321 may be positioned between two of the antennas 320. In some embodiments, all but one of the antennas 320 is positioned between two of the antennas 321. In those embodiments, all but one of the antennas 321 may be positioned between two of the antennas 320. In some embodiments, the antennas 320 and the antennas 321 may each have only one antenna.

In some embodiments, the first electrode 258 has a first terminal 310, and the second electrode 260 has a second terminal 311. The first terminal 310 may be a contact between the first electrode 358 and the power source 270, the power supply 275, or a ground. The second terminal 311 may be a contact between the second electrode 260 and the power source 270, the power source 270, or a ground. The first terminal 310 and the second terminal 311 are shown as being at one end of the first electrode 258 and the second electrode 260, respectively. In other embodiments, the first terminal 310 and the second terminal 311 may be positioned at other locations on the first electrode 258 and the second electrode, respectively. The first terminal 310 and the second terminal 311 have different shapes and sizes than the first support structure 330 and the support structure 331, respectively. In other embodiments, the first terminal 310 and the second terminal 311 may have generally the same shapes and sizes as the first support structure 330 and the support structure 331, respectively.

In operation, a voltage may be supplied from a power supply, such as the power source 270, the power source 274, or the power supply 275, to the first terminal 310, the second terminal 311, and/or the substrate support assembly 238. The supplied voltage creates an electric field between each antenna of the one or more antennas 320 and each antenna of the one or more antennas 321. The electric field will be strongest between an antenna of the one or more antennas 320 and an adjacent antenna of the one or more antennas 321. The interleaved and aligned spatial relationship of the antennas 320, 321 produces an electric field in a direction parallel to the plane defined by the first surface 234 of the substrate support assembly 238. The substrate 240 is positioned on the first surface 234 such that the latent image lines 255 are parallel to the electric field lines generated by the electrode assembly 216. Since the charged species 355 are charged, the charged species 355 are affected by the electric field. The electric field drives the charged species 355 generated by the photoacid generators in the photoresist layer 250 in the direction of the electric field. By driving the charged species 355 in a direction parallel with the latent image lines 255, line edge roughness may be reduced. The uniform directional movement is shown by the double headed arrow 370. In contrast, when a voltage is not applied to the first terminal 310 or the second terminal 311, an electric field is not created to drive the charged species 355 in any particular direction. As a result, the charged species 355 may move randomly, as shown by the arrows 370', which may result in wariness or line roughness.

Figure 4:
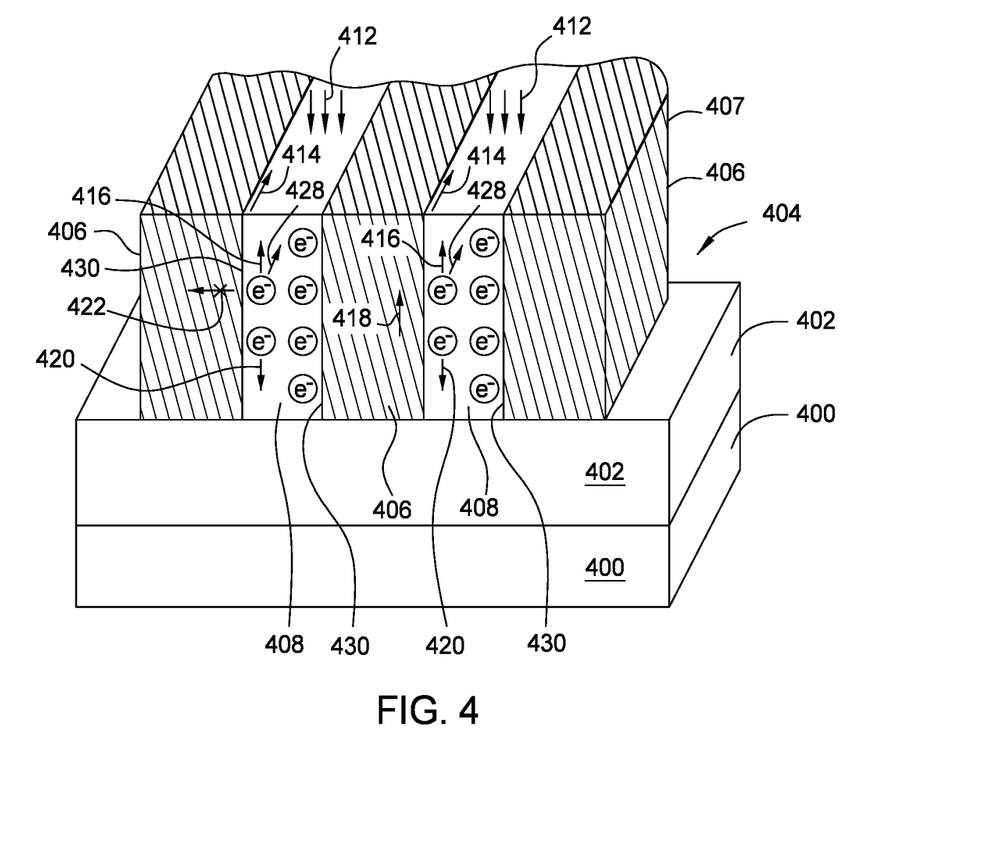
FIG. 4 depicts an acid distribution control of a photoresist layer disposed on a film structure during a post-exposure baking process.

FIG. 4 depicts a film structure 404 disposed on a substrate 400 after a lithography exposure process. A photoresist layer 407 is disposed on the film structure 404. The film structure 404 includes a target layer 402 disposed on a substrate 400. The target layer 402 is later patterned for forming the desired device features in the target layer 402. It is noted that additional layers, such as a hardmask, an underlayer, such as an organic material, an inorganic material, or a mixture of organic or inorganic materials, or other suitable materials may be disposed on the target layer 402 and below the photoresist layer 407 as needed to enhance the lithography resolution and photoresist profile control.

The photoresist layer 407 may be a positive-tone photoresist and/or a negative-tone photoresist that are capable of undergoing a chemically amplified reaction. The photoresist layer 407 is a polymer organic material.

In the embodiment wherein an underlayer or a hardmask layer is used, the underlayer may include one or more additives, such as acid agents, (e.g., photoacid generators (PAGs) or acid catalysts), base agents, adhesion promoters or photo-sensitive components. The one or more additives may be disposed in organic solvent or resin and/or an inorganic matrix material. Suitable examples of the acid agents including photoacid generators (PAGs) and/or acid catalysts may be selected from a group consisting of sulfonic acids (e.g., p-toluenesulfonic acid, styrene sulfonic acid), sulfonates (e.g., pyridinium p-toluenesulfonate, pyridinium trilluoromethanesulfonate, pyridinium 3-nitrobenzensulfonate), and mixtures thereof. Suitable organic solvent may include homo-polymers or higher polymers containing two or more repeating units and polymeric backbone. Suitable examples of the organic solvent include, but are not limited to, propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof.

In one example, the underlayer provides active acid agents, base agents or ionic/non-ionic species during the lithographic exposure process, pre-exposure baking process, or post-exposure baking process, to assist control of the photoacid flow direction from the upper photoresist layer 407.

The hardmask layer may be an antireflective coating layer (ARC) layer fabricated from a group consisting of silicon oxide, silicon nitride, silicon oxynitride, silicon carbide, amorphous carbon, doped amorphous carbon, TEOS oxide, USG, SOG, organic silicon, oxide containing material titanium nitride, titanium oxynitride, combinations thereof and the like.

As discussed above, an electric field from the electrode 116, as well as a magnetic field from the magnets 296, may be applied during a lithography exposure process, pre-exposure baking process, or post-exposure baking process, particularly, a post exposure baking process. In the example depicted in FIG. 4, the electric field and/or magnetic field is applied after a lithography exposure process during the post-exposure baking process. During post-exposure baking process, a thermal energy is applied to the substrate 400 as well as the electric field and/or the magnetic field. Photoacid, shown as $e^-$ in FIG. 4, is generated in the first region 408 in the photoresist layer 407 where the photoacid generator (PAG) therein has been exposed to light radiation 412, such as a UV light radiation, from the previous lithography exposure process. However, oftentimes, movement of photoacid are generally random and photoacid distribution may not be evenly distributed in the first region 408 or may not have a clear boundary set at the interface 430 formed in a plane (interfaced with the second region 406) defined between the first region 408 and the second region 406, resulting in a portion of photoacid drifting and diffusing into the second region 406, as shown by the arrow 422, not intended to have photoacid generation. As such, lateral photoacid movement (e.g., a direction parallel to a planar surface of the substrate 400) drifting into the second region 406, as shown by the arrow 422, may result in line edge roughness, resolution loss, photoresist footing, profile deformation, and/or narrow window for the depth of focus (DOF) during the lithography process, causing inaccurate feature transfer to the underlying target layer 402 and/or eventually leading to device failure.

Although the example discussed here is shown as the movement of electrons from the photoacid, it is noted that any suitable species, including charges, charged particles, photons, ions, electrons, or reactive species in any forms, may also have similar effects when the electric field is applied to the photoresist layer 407.

By applying an electric field and/or a magnetic field to the photoresist layer 407 during the post-exposure baking process, distribution of photoacid in the exposed first region 408 may be efficiently redirected, controlled and confined. The electric field as applied to the photoresist layer 407 may move photoacid in a vertical direction (e.g., y direction shown by arrows 416 and 420 substantially perpendicular to the planar surface of the substrate 400) with minimal lateral motion (e.g., x direction shown by the arrow 422) without diffusing into the adjacent second region 406. Generally, photoacid may have certain polarity that may be effected by the electric field or magnetic field applied thereto, thus orienting photoacid in certain directions, and creating a desired directional movement of the photoacid in the exposed first region 408 without crossing into the adjacent protected second region 406. Furthermore, the photoresist line edge roughness, process window for the depth of focus (DOF) during the lithography process, and line critical dimension uniformity may also be well controlled, enhanced and improved when performing the post-exposure baking process.

In one example, the photoacid may further be controlled to move directionally at a longitudinal direction (e.g., z direction shown by arrow 428, defined in a plane interfaced with the second region 406 of the photoresist layer 407 protected by the photomask 410) along a lateral plane, as shown by arrow 414, so as to control the longitudinal distribution of photoacid confined in the exposed first region 408 without crossing in a x direction, as shown by arrow 422, into the second region 406 of the photoresist layer 407. The magnetic field generated to the photoresist layer 407 may cause the electrons to orbit along a certain magnetic line, such as the longitudinal direction (e.g., z direction shown by arrow 428) so as to further control the photoacid in a desired three-dimensional distribution. The interaction between the magnetic field and the electric field may optimize trajectory of photoacid at a certain path as desired and confined in the exposed first region 408. Furthermore, vertical photoacid movement is desired to smooth out standing waves that are naturally produced by the light exposure tool, thus enhancing exposure resolution.

In one embodiment, an electric field having a strength between about 100 MV/m and about 2000 MV/m may be applied to the photoresist layer 407, during a post-exposure baking process, to confine photoacid generated in the photoresist layer 407 in a vertical direction, e.g., in a y direction. In one embodiment, a magnetic field of between 5 Tesla (T) and 500 Tesla (T), along with the electric field, may be applied to the photoresist layer 407, during a post-exposure baking process, to confine photoacid generated in the photoresist layer 407 in both longitudinal direction and a vertical direction, e.g., in y and z directions, with minimum lateral direction, e.g., in x direction. While exposed to the combination of the magnetic field along with the electric field, the photoacid as generated may be further confined to be distributed in the longitudinal direction, e.g., in the direction shown by the arrow 428, remaining in the first region 408 of the photoresist layer 407, parallel along the interface 430 within the exposed first region 408.

In one embodiment, the electric field and the magnetic field may be applied separately as needed. One or more characteristics of at least one electric field and the magnetic field may be dynamically changed during the application period to control the shape of the fields over time such as causing the fields to have different density, amplitude and/or shape over multiple periods within the post-exposure baking process. For example, the electric field applied during the post-exposure baking process may be controlled in a manner that can confine the movement of the photoacid at certain directions and manners. In one example, during the post-exposure baking process, the power as supplied to generate the electric field may be controlled in a range between about 100 volts and about 5000 volts, such as between about 100 volts and about 1000 volts.

In one example, power may be applied in a modulated manner. The power may be modulated by modulating at least one of current and voltage. The frequency of the power modulation is greater than 0.1 Hz, for example between 0.5 and 10 Hz. Additionally, the duty cycle of the power application is be between 25 and 75 percent, but may alternatively have duty cycles that are larger or smaller. For example, the power may be applied during multiple periods that separated by period of no power application.

In one example, voltage is modulated while holding current constant. Voltage may be modulated in a step-wise manner, in a linear manner, or using other voltage application curve. When modulated in a step-wise manner, the voltage may be modulated between a first voltage and a lower second voltage. In a first example, both the first and second voltages are positive. In a second example, the first voltage is positive and the second voltage is zero. In a third example, the first voltage is positive and the second voltage is negative. In the second and third examples above, the amplitude of the first voltage is greater than or equal to the amplitude of the second voltage. In the examples above, the duration of the application of the first voltage may be the same, longer or shorter than the duration of the application of the second voltage. In the examples above, the application of the first and second voltages may be cycled at least two times per second, such as at least 30-120 times per second. Additionally, the application of the first and second voltages may be cycled at a first frequency for a first period of time, while the application of the first and second voltages are cycled at a second frequency for a second period of time. Optionally, a third voltage may be applied after application of the first and second voltages, and before cycling through a second application of the first and second voltages.

In another example, current is modulated while holding voltage constant. Current may be modulated in a step-wise manner, in a linear manner, or using other current application curve. When modulated in a step-wise manner, the current may be modulated between a current voltage and a lower second current. In a first example, both the first and second currents are positive. In a second example, the first current is positive and the second current is zero. In a third example, the first current is positive and the second current is negative. In the second and third examples above, the amplitude of the first current may be greater than or equal to the amplitude of the second current. In the examples above, the duration of the application of the first current may be the same, longer or shorter than the duration of the application of the second current. In the examples above, the application of the first and second currents may be cycled at least two times per second, such as at least 30-120 times per second. Additionally, the application of the first and second currents may be cycled at a first frequency for a first period of time, while the application of the first and second currents are cycled at a second frequency for a second period of time. Optionally, a third current may be applied after application of the first and second currents, and before cycling through a second application of the first and second currents.

In yet another example, both the current and voltage are modulated simultaneously.

In other examples, at least one or both of magnetic and electric fields may be modulated. The magnetic and/or electric fields may be modulated with or without modulating the power. The frequency of the magnetic and/or electric field is greater than 0.1 Hz, for example between 0.5 and 10 Hz. Additionally, the duty cycle of the magnetic and/or electric field application is be between 25 and 75 percent, but may alternatively have duty cycles that are larger or smaller. For example, one or both of the magnetic and/or electric fields may be applied during multiple periods that separated by period of no field application.

In one example, the electric field is modulated while not modulating the magnetic field. The electric field may be modulated in a step-wise manner, in a linear manner, or using other electric application curve. When modulated in a step-wise manner, the electric field may be modulated between a first electric field density and a lower second electric field density. In a first example, both the first and second electric fields are positive. In a second example, the first electric field is positive and the second electric field is zero. In a third example, the first electric field is positive and the second electric field is negative. In the second and third examples above, the amplitude of the first electric field is greater than or equal to the amplitude of the second electric field. In the examples above, the duration of the application of the first electric field may be the same, longer or shorter than the duration of the application of the second electric field. In the examples above, the application of the first and second electric fields may be cycled at least two times per second, such as at least 30-120 times per second. Additionally, the application of the first and second electric fields may be cycled at a first frequency for a first period of time, while the application of the first and second electric fields are cycled at a second frequency for a second period of time. Optionally, a third electric field may be applied after application of the first and second electric fields, and before cycling through a second application of the first and second electric fields.

In another example, the magnet field is modulated while not modulating the electric field. The magnetic field may be modulated in a step-wise manner, in a linear manner, or using other magnetic application curve. When modulated in a step-wise manner, the magnetic field may be modulated between a first magnetic field density and a lower second magnetic field density. In a first example, both the first and second magnetic fields are positive. In a second example, the first magnetic field is positive and the second magnetic field is zero. In a third example, the first magnetic field is positive and the second magnetic field is negative. In the second and third examples above, the amplitude of the first magnetic field is greater than or equal to the amplitude of the second magnetic field. In the examples above, the duration of the application of the first magnetic field may be the same, longer or shorter than the duration of the application of the second magnetic field. In the examples above, the application of the first and second magnetic fields may be cycled at least two times per second, such as at least 30-120 times per second. Additionally, the application of the first and second magnetic fields may be cycled at a first frequency for a first period of time, while the application of the first and second magnetic fields are cycled at a second frequency for a second period of time. Optionally, a third magnetic field may be applied after application of the first and second magnetic fields, and before cycling through a second application of the first and second magnetic fields.

Furthermore, the voltage power as applied may be in continuous mode or in pulse mode as needed. In one example, the voltage power as applied to generate the electric field is in pulse mode. In one example, the voltage power as supplied for generating the electric field may be pulsed between about 5% and about 75% of each duty cycle. Each duty cycle, for example between each time unit, is between about 0.1 seconds and about 10 seconds, such as about 5 seconds.

In one example, the frequency of the electric field as generated may be adjusted or altered at any point during the post-exposure baking process. In one example, the electric field may be generated under a dynamic frequency control mode during the post-exposure baking process. For example, the frequency of the electric field as generated may be altered from a first level to a second level during a set period time, such as every 0.5 seconds to about every 10 seconds as needed. The frequency of the electric field as generated may be switched back and forth between the first level and the second level at the given time mode as needed. At each switch, the selected level of the frequency of the electric field may be stayed for a determined period of time, such as about from between about 0.5 seconds and about 5 seconds as needed. By dynamically changing the frequency of the electric field as generated, the profile of the photoresist layer may also be altered as needed.

Figure 6:
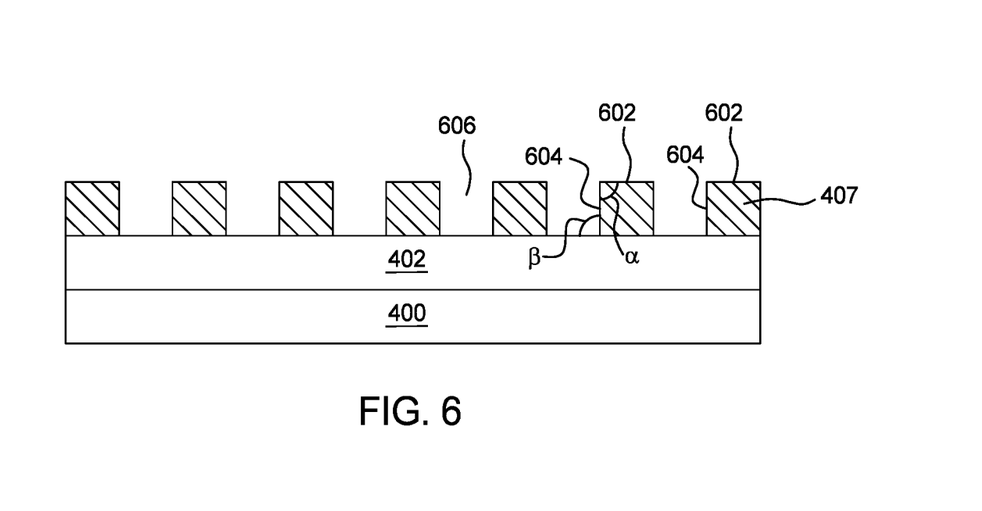
FIG. 6 depicts a schematic cross-sectional view of a photoresist layer on a substrate after a post-exposure baking process.

Referring first to exposed photoresist layer 407 depicted in FIG. 6. The photoresist layer 407, similar to the photoresist layer 407 depicted in FIG. 4 discussed above, has sidewalls 604 and a top surface 602. The photoresist layer 407 is disposed on a top surface 606 of the target layer 402. The top surface 602 and the sidewall 604 define a first angle α (e.g., a corner angle). When the dynamic frequency control mode of the electric field applied during the post-exposure baking process is utilized, the first angle α may be obtained and controlled at between about 75 degrees and 105 degrees, such as between about 85 degrees and about 95 degrees, for example close to the ideal right angle of 90 degrees. Similarly, the sidewall 604 of the photoresist layer 407 and the top surface 606 of the target layer 402 also define a second angle β (e.g., a corner angle) between about 75 degrees and 105 degrees, such as 85 degrees and about 95 degrees, such as close to the ideal right angle of 90 degrees. As the conventional practice often has scum left on the top surface 606 of the target layer 402, by utilizing the dynamic frequency control mode of the electric field applied during the post-exposure baking process, a relatively clean surface, such as residual and/or scum free surface, may be obtained. Furthermore, due to the cleaner surface, the profile of the photoresist layer 407 may also be better controlled after the development process. Some defects, such as photoresist footing, sidewall overhang, or top portion taper, may be eliminated to provide the photoresist layer 407 with the desired profile, such as a substantially vertical sidewall and/or the first and the second angles α,β controlled between about 85 degrees and about 95 degrees.

Thus, by accurate control of the profile of the photoresist layer 407, similar angle control at the corners of the features transferred into the target layer 402 (e.g., a material layer) may also be obtained. Thus, the features or openings transferred to the target layer 402 may also have a good profile with the desired corner angles controlled at a range between about 85 degrees and about 95 degrees. Accordingly, with the well-controlled and desired profiles of the photoresist layer 407, a high resolution of the lithography process may be obtained with enhanced and enlarged process window, particular the depth of focus (DOF) during the lithography process. For example, the process window for the depth of focus (DOF) may be increased from 20% to about 95%.

Furthermore, during the post-exposure baking process, the thermal energy supplied to the substrate 400, and to the photoresist layer 407, may be controlled in a manner that can also assist in confining the photoacid movement in the photoresist layer 407. The thermal energy may be supplied by controlling the embedded heater 232 disposed in the substrate support assembly 238. In one example, the temperature of the substrate 400 may be controlled at between about 10 degrees Celsius (such as room temperature) and about 130 degrees Celsius, such as about 120 degrees Celsius. It is believed that the thermal energy supplied during the post-exposure baking process may enhance the kinetic energy or the momentum of the electrons driven by the electric and/or magnetic fields so that the control efficiency of the photoacid movement may be enhanced.

In some embodiments, the thermal energy supplied to the substrate 400 may be prior to, synchronized with, or after the time period in which the electric field and/or magnetic field are supplied. In one example, the thermal energy (e.g., turning on the heaters 232 in the substrate support assembly 238 where the substrate 400 is placed) is supplied to the substrate 400 prior to applying the electric field and/or the magnetic field to the substrate 400. It is believed that the thermal energy supplied prior to the electric field and/or the magnetic field may assist activating the electrons to an active state, so that the electrons may be relatively easier to be confined or accelerated at a predetermined moving path, thus enhancing the electrical performance of the photoresist layer during the post-exposure baking process, such as photon absorption efficiency, dose sensitivity, or drift directionality control. As electrons are activated and/or driven not only by the electric field/magnetic field, but also by the thermal energy, the total process time, such as the total time for performing the post-exposure baking process, may be reduced to a range between about 5% and about 40%, such as about 20%, less than the process time for only applying the thermal energy during the post-exposure baking process.

After the post-exposure baking process, an anisotropic etching process, or other suitable patterning/etching processes, may be performed to transfer features into the target layer 402 as needed.

Figure 5:
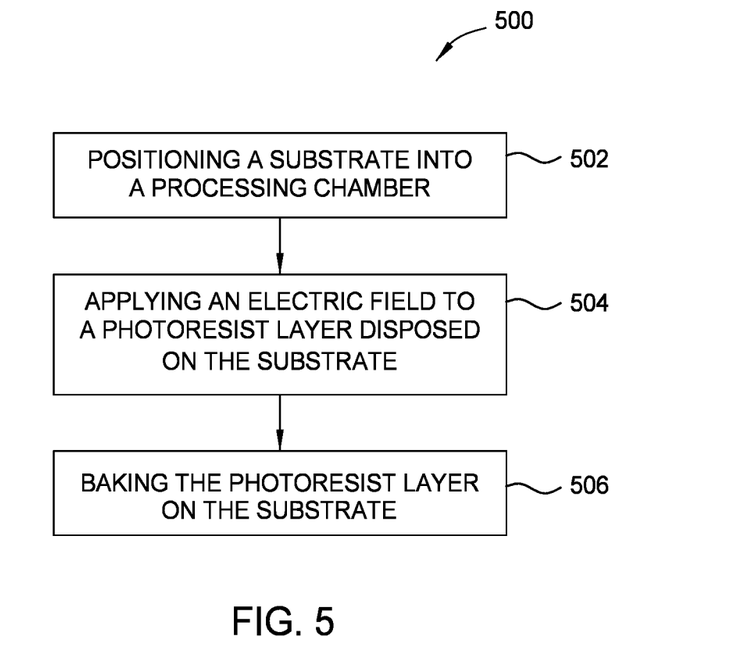
FIG. 5 is a flow diagram of one method to control acid distribution of a photoresist layer during an exposure process and a post-exposure baking process.

FIG. 5 depicts a flow diagram of a method 500 for utilizing an electric field and a magnetic field to assist controlling photoacid distribution/diffusion/directionality control in a photoresist layer during a post-exposure baking process. The method 500 begins at operation 502 by positioning a substrate, such as the substrate 400 described above, into a processing chamber, such as the processing chamber 200 depicted in FIGS. 2-3, with an electrode assembly and a magnetic assembly disposed therein.

At operation 504, after the substrate 400 is positioned, an electric field and/or a magnetic field may be individually or collectively applied to the processing chamber (during a lithographic exposure process and/or post-exposure baking process) to control photoacid movement within in a photoresist layer having an underlayer disposed thereunder. It is noted that the electric field and/or the magnetic field may be applied simultaneous with, prior to, or after baking the substrate 400, as will be further discussed at operation 506. In other words, the electric field and/or a magnetic field individually or collectively applied to the substrate at operation 504 may be performed prior to or after the baking process at operation 506 as needed.

After the electric field and/or a magnetic field is individually or collectively applied to the photoresist layer and the underlayer disposed on the substrate, photoacid as generated may move primarily in a vertical direction, a longitudinal direction, a circular direction, or any desired direction as needed. As a result of the assistance provided by the electric field and/or a magnetic field during the post-exposure baking process, the photoacid movement in the photoresist layer may be efficiently controlled.

At operation 506, a thermal energy is provided to bake (e.g., cure) the photoresist layer. During the post-exposure baking process, an energy (e.g., an electric energy, thermal energy or other suitable energy) may also be provided to the photoresist layer. In one example depicted here, the energy is a thermal energy provided to the substrate during the post-exposure baking process as well as the electric field and/or the magnetic field applied at operation 504. By utilizing the dynamic frequency control mode while applying the electric field and/or the magnetic field at operation 506, a desired edge profile with high resolution, dose sensitivity, resistance to line collapse, enhanced process window for the depth of focus (DOF) and minimum line edge roughness may be obtained. The photoacid, quencher, ions, electron, and other charge species in the photoresist layer may be efficiently guided so as to move in desired directions. Thus, the benefits of applying the electric field and/or magnetic field during the post-exposure baking process include enhanced process window for the depth of focus (DOF), desired minimum line edge roughness, line width roughness, local critical dimension uniformity, critical dimension viability and nano-defect (such as resist scumming, line merge, line breaking, and the like) reduction. As a result, the device yield is improved.

In one example, the power supplied to control the electric and/or the magnetic field may be in continuous mode, pulsed mode, or a combination of mixed continuous or pulsed mode as needed.

The previously described embodiments have many advantages, including the following. For example, the embodiments disclosed herein may reduce or eliminate line edge/width roughness with high resolution and sharp edge profile and enhance the process window for the depth of focus (DOF) during the lithography process by a dynamic frequency control mode when applying electric and/or magnetic field during a post-exposure baking process. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
    applying a photoresist layer comprising a photoacid generator on a material layer disposed on a substrate;
    exposing a first portion of the photoresist layer unprotected by a photomask to light radiation in a lithographic exposure process;
    providing a thermal energy to the photoresist layer in a post-exposure baking process;
    applying at least one of an electric field or a magnetic field while performing the post-exposure baking process;
    dynamically changing a characteristic of at least one of the electric field or the magnetic field while providing the thermal energy to the photoresist layer to change a direction of a particle within the photoresist layer from a first direction to a second direction;
    controlling a photoresist line edge roughness and resist scumming while performing the post-exposure baking process;
    removing the first portion of the photoresist layer to form openings in the photoresist layer; and
    performing an etching process to etch the material layer through the openings in the photoresist layer and form features in the material layer.

2. The method of claim 1, wherein the dynamically changing the characteristic of at one of the electric field of the magnetic field controls the photoresist line edge roughness and resist scumming.

3. The method of claim 1, wherein applying the electric field or magnetic field further comprises:
    cycling the applying of the electric field or magnetic field at least two times per second.

4. The method of claim 1, wherein dynamically changing a characteristic of at least one of the electric field or the magnetic field further comprises:
    applying power in step-wise manner, in a linear manner, or in a power curve.

5. The method of claim 4, wherein the power generating the electric field is modulated between a first electric field density and a lower second electric field density.

6. The method of claim 4, wherein the power generating of the electric field is modulated by modulating voltages between a first voltage and a lower second voltage to provide a first electric field and a second electric field, wherein both the first and second voltages generating the first and second electric fields are positive.

7. The method of claim 4, wherein the power generating of the electric field is modulated by modulating voltages between a first voltage and a lower second voltage to provide a first electric field and a second electric field, wherein one of the first and second voltages generating the first and second electric fields is zero.

8. The method of claim 4, wherein the power generating of the electric field is modulated by modulating voltages between a first voltage and a lower second voltage to provide a first electric field and a second electric fields, wherein the first and second voltages generating the first and second electric fields have opposite polarities.

9. The method of claim 4, wherein the power generating of the electric field is modulated to provide a first electric field and a second electric field, wherein at least one of an amplitude, shape or power density of the first electric field is greater than or equal to at least one of an amplitude, shape or power density of the second electric.

10. The method of claim 1, wherein an electric field strength is controlled between about 100 MV/m and about 2000 MV/m during the post-exposure baking process.

11. The method of claim 1, wherein applying the electric field or the magnetic field further comprises:
    controlling the magnetic field at a range between about 5 Tesla (T) and about 500 Tesla (T).

12. The method of claim 1, wherein the particle is one of a charge, a charged particle, a photon, an ion, an electron, or a reactive species which is configured to have movement imparted thereon by the electric field or the magnetic field.

13. The method of claim 1, wherein the second direction is perpendicular to the first direction.

14. The method of claim 13, wherein the first direction is parallel to a top surface of the substrate and the second direction is perpendicular to the top surface of the substrate.

15. A method of processing a substrate, the method comprising:
    applying a photoresist layer on a substrate;
    exposing a first portion of the photoresist layer unprotected by a photomask to a light radiation in a lithographic exposure process;
    performing a post-exposure baking process on the photoresist layer;
    changing a drifting direction of a photoacid generator vertically in the photoresist layer from a first drifting direction to a second drifting direction while providing a thermal energy to the photoresist layer, wherein the second drifting direction is perpendicular to the first drifting direction and the changing of the drifting direction of the photoacid generator is performed by dynamically changing an electric field or a magnetic field during the post-exposure baking process to control a photoresist line edge roughness and resist scumming;

removing the first portion of the photoresist layer to form openings in the photoresist layer; and performing an etching process to etch a material layer through the openings in the photoresist layer and form features in the material layer.

16. The method of claim 15, wherein changing the drifting direction of the photoacid generator further comprises:

modulating an electric field to provide a first electric field and a second electric field, wherein at least one of an amplitude, shape or power density of the first electric field is greater than or equal to at least one of an amplitude, shape or power density of the second electric field while providing the thermal energy to the photoresist layer.

17. The method of claim 16, wherein the modulating the electric field further comprises:

applying a first voltage and a second voltage during different periods of the post-exposure baking process, wherein at least one of (a) the first voltage is zero or has a positive polarity, (b) and second voltage is zero or has a negative polarity.

18. The method of claim 15, wherein the photoacid generator comprises a charge, a charged particle, a photon, an ion, an electron, or a reactive species which is configured to have movement imparted thereon by the electric field or magnetic field.

19. The method of claim 15, wherein the modulating the electric field further comprises:

applying power in step-wise manner, in a linear manner, or in a power curve.

20. The method of claim 15, wherein changing the drifting direction of the photoacid generator further comprises:

modulating magnetic field.

* * * * *